United States Patent
Hong et al.

(10) Patent No.: US 7,603,598 B2
(45) Date of Patent: Oct. 13, 2009

(54) SEMICONDUCTOR DEVICE FOR TESTING SEMICONDUCTOR PROCESS AND METHOD THEREOF

(75) Inventors: Chia-Nan Hong, Hsin-Chu (TW); Yi-Hua Chang, Hsin-Chu Hsien (TW); Chin-Yi Chang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 322 days.

(21) Appl. No.: 11/695,610

(22) Filed: Apr. 3, 2007

(65) Prior Publication Data

US 2008/0246502 A1 Oct. 9, 2008

(51) Int. Cl.
*G01R 31/28* (2006.01)

(52) U.S. Cl. ............ 714/724; 714/30; 714/733; 714/734; 714/736; 714/742; 714/745; 700/108; 438/14; 702/182; 257/48; 324/500; 324/765

(58) Field of Classification Search .......... None
See application file for complete search history.

(56) References Cited

U.S. PATENT DOCUMENTS

| | | | | |
|---|---|---|---|---|
| 6,756,787 | B2 * | 6/2004 | Ohlhoff et al. | 324/537 |
| 7,046,026 | B2 * | 5/2006 | Chao et al. | 324/765 |
| 7,446,552 | B2 * | 11/2008 | Cano et al. | 324/765 |
| 2004/0257104 | A1 * | 12/2004 | Fujinaga et al. | 324/765 |
| 2005/0090922 | A1 | 4/2005 | Kinoshita | |
| 2008/0099762 | A1 * | 5/2008 | Garcia et al. | 257/48 |

* cited by examiner

*Primary Examiner*—John P Trimmings
(74) *Attorney, Agent, or Firm*—Winston Hsu

(57) ABSTRACT

A semiconductor device for testing a semiconductor process applied to manufacturing the semiconductor device is disclosed. The semiconductor device includes at least a testing group. The testing group includes a first testing block and a second testing block. The first testing block includes: a first input node; a first output node; a plurality of first selecting nodes; a first reference device, coupled to the first input node and the first output node; and a first target device, coupled to the first selecting nodes and the first output node. The second testing block includes: a second input node; a second output node; a plurality of second selecting nodes; a second reference device, coupled to the second input node and the second output node; and a second target device, coupled to the second selecting nodes and the second output node.

17 Claims, 5 Drawing Sheets

SEMICONDUCTOR DEVICE FOR TESTING SEMICONDUCTOR PROCESS AND METHOD THEREOF

BACKGROUND OF THE INVENTION

1. Field of the Invention

The present invention relates to a device and method for testing a semiconductor process, more particularly, to a semiconductor device and related method for testing a semiconductor process failure rate using a differential testing configuration.

2. Description of the Prior Art

In the semiconductor industry, the purpose of DFM (Design for manufacture) is to monitor semiconductor nanometer processes for understanding process failure, to reduce design sensitivity in manufacturing variations, and to create accurate yield models. Therefore, semiconductor process controls in the nanometer area have comparatively more difficult challenges because of its sensitivity on product yield. A major challenge in DFM is how to evaluate yield loss, and to create an accurate yield model. According to the prior art, the monitoring process measures a large number of semiconductor resistors to obtain absolute value of the overall resistance for process monitoring purposes. There are several conventionally existing methods to perform process monitoring. Please refer to FIG. 1. FIG. 1 shows a conventional Kevin structure to measure resistance. In the Kevin structure, one resistor 14 requires a first pin 10, a second pin 12, a third pin 16, and a fourth pin 18 as test points in determining its resistance. Therefore the testing structure in FIG. 1 requires a plurality of pins to measure the resistance of each individual component (e.g., the resistor 14). Using the conventional Kevin structure, only the exact resistance value of each single component can be measured. Another conventional testing scheme is disclosed in patent application US 2005/0090922 A1, where a mesh type circuit is taught to measure exact resistance value of a single component.

Furthermore, if a chain of under test devices (DUT), such as a chain of N resistors, has been tested, there will have three possible measurement results as shown in FIG. 2. FIG. 2 is a diagram illustrating the measurement results according to the prior art testing method. The first one is the measurement result is within an acceptable range 21, which is caused by process variation. The second one is the measurement result is within a soft fail areas 22. The third one is the measurement result is in a hard fail areas 23. Because the measurement result is the total resistances of the chain of N resistors, when the measurement result is located in the soft fail areas 22, it is hard to determine that what problem was happened to the chain of N resistors. For the example, there may have one resistor be almost failed that to increase the total resistances locate within the soft fail area 22, or there may be a soft fail occurred to the chain of N resistors. Furthermore, the former one can be very dangerous when in using, although the measurement result is located in the soft fail area 22. Therefore, the above-mentioned prior art testing schemes are unable to determine if a non-ideal measurement result is caused by the soft fail or a process failure in a semiconductor process.

SUMMARY OF THE INVENTION

It is therefore one of the objectives of the present invention to provide a testing apparatus and method to discern a hard fail and a soft fail defect with reduced test pins in semiconductor process.

According to the present invention, a semiconductor device for testing a semiconductor process applied to manufacturing the semiconductor device is disclosed. The semiconductor device comprises at least a testing group and a measuring device. The testing group comprises a first testing block and a second testing block. The first testing block comprises: a first input node; a first output node; a plurality of first selecting nodes; a first reference device, coupled to the first input node and the first output node; and a first target device, coupled to the first selecting nodes and the first output node, where the first target device comprises a plurality of first devices under test (DUTs) each coupled to a first selecting node. The second testing block comprises: a second input node; a second output node; a plurality of second selecting nodes; a second reference device, coupled to the second input node and the second output node; and a second target device, coupled to the second selecting nodes and the second output node, where the second target device comprises a plurality of second devices under test (DUTs) each coupled to a second selecting node. The first DUTs and the second DUTs have a one-to-one relationship. The measuring device is coupled to the semiconductor device, for coupling the first input node and the second input node to a first input signal, coupling a specific first selecting node and a specific second selecting node to a second input signal, and then measuring a difference between output signals at the first output node and the second output node to evaluate the semiconductor process. A specific first DUT coupled to the specific first selecting node corresponds to a specific second DUT coupled to the specific second selecting node according to the one-to-one relationship.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
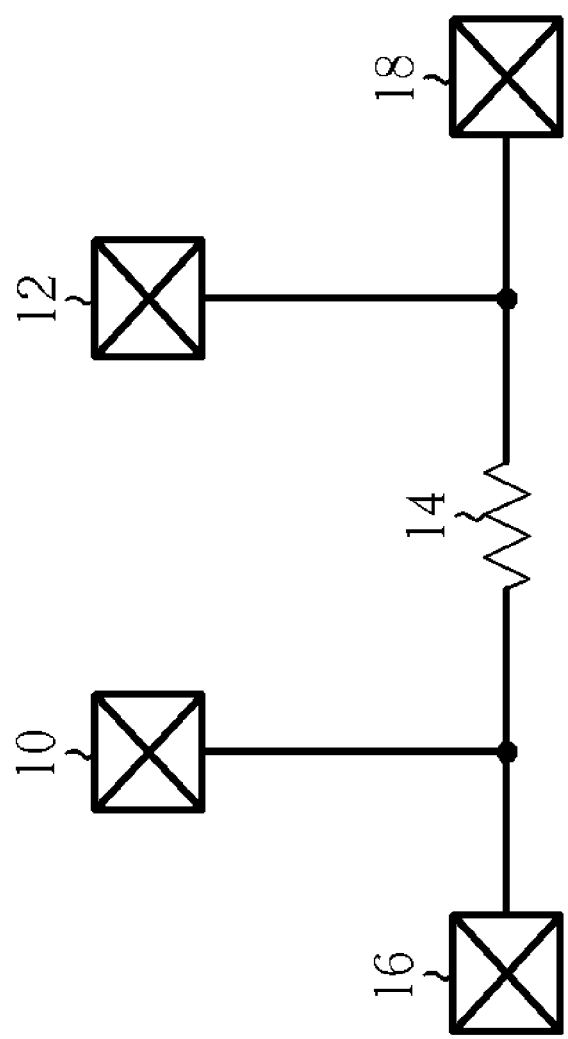
FIG. 1 shows a conventional Kevin structure for measuring resistance.
Figure 2:
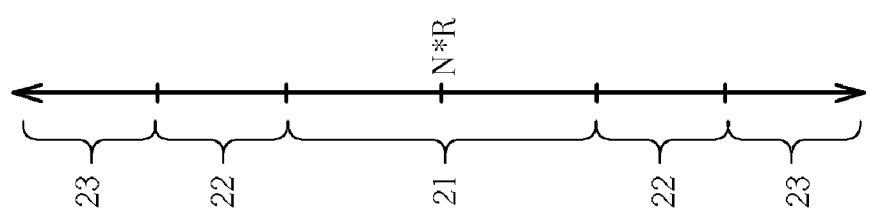
FIG. 2 is a diagram illustrating the measurement results according to the prior art testing method.
Figure 3:
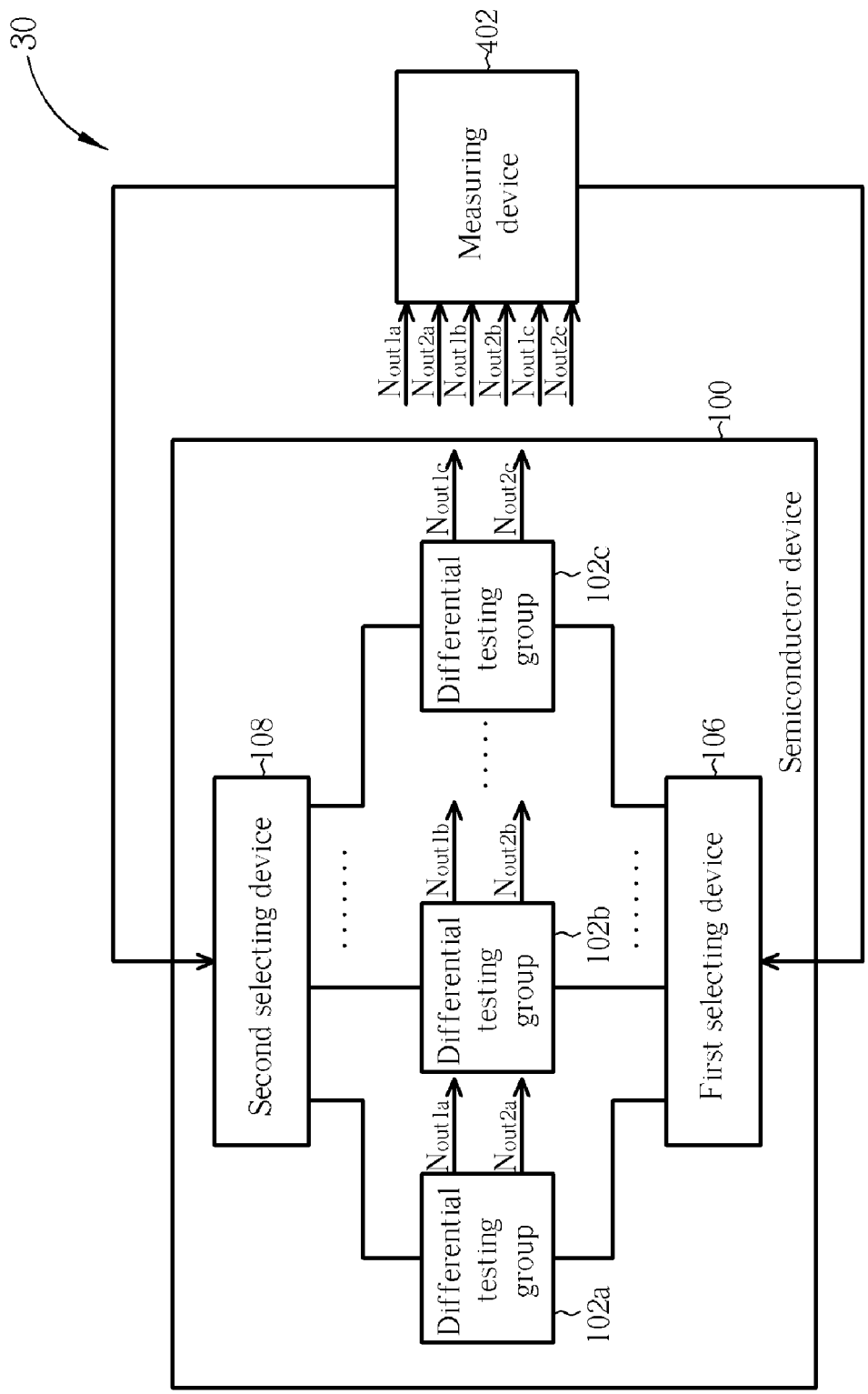
FIG. 3 illustrates a schematic diagram of a testing system according to an embodiment of the present invention.

In a semiconductor manufacturing process, a test circuit is required to measure process failure rates, such as a via failure rate. Therefore, an embodiment of the present invention provides a design for manufacture (DFM) model to set DFM rule priority and estimate a chip yield rate. Please refer to FIG. 3. FIG. 3 illustrates a diagram of a testing system 30 according to an embodiment of the present invention. As shown in FIG. 3, the testing system 30 includes a semiconductor device 100, and a measuring device 402 for testing a semiconductor process applied to the manufacturing of a semiconductor device 100. In this embodiment, the semiconductor device 100 comprises a plurality of differential testing groups 102a, 102b, . . . 102c. Please note that only three differential testing groups are shown for illustrative purposes, although in practice more or less may exist depending on the desired test scenario. In addition, each solid line shown in FIG. 3 represents a group from a plurality connecting lines.

Figure 4:
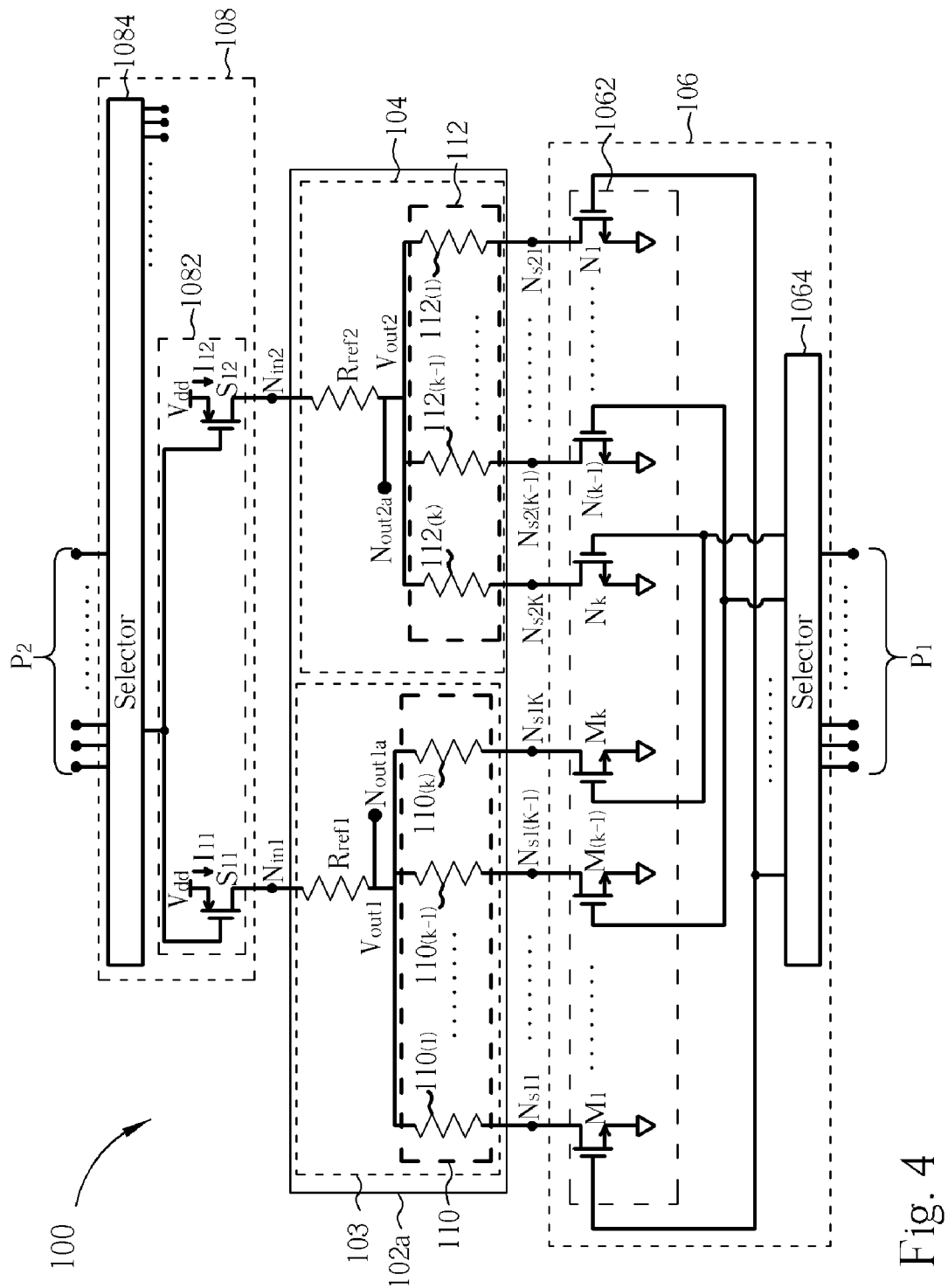
FIG. 4 illustrates a circuit diagram of the semiconductor device shown in FIG. 3.

Please refer to FIG. 4. FIG. 4 illustrates a circuit diagram of the semiconductor device 100 shown in FIG. 3. The first selecting device 106 includes a selector 1064 and a switch circuit 1062, wherein the switch circuit 1062 further includes a plurality of switch units implemented by transistors $M_1$-$M_K$, $N_1$-$N_K$. The selector 1064 is coupled to the measuring device 402 shown in FIG. 3 through a plurality of pins $P_1$ of the semiconductor device 100. The second selecting device 108 includes a selector 1084 and a switch circuit 1082, wherein the switch circuit 1082 includes a plurality of switch units. Please note that only two switch units implemented by transistors $S_{11}$, $S_{12}$ are shown in FIG. 4 for illustrative purposes. The selector 1084 is coupled to the measuring device 402 as shown in FIG. 3 through a plurality of pins $P_2$ of the semiconductor device 100. In this embodiment, all of the differential testing groups 102a-102c in FIG. 3 have the same circuit configuration. Therefore, only one differential testing group 102a as shown in FIG. 4 is used to illustrate the semiconductor process testing operation. As shown in FIG. 4, the differential testing group 102a comprises a first testing block 103 and a second testing block 104. The first testing block 103 comprises: a first input node Nin1, a first output node Nout1a, a plurality of first selecting nodes $N_{s11}$, ..., $N_{s1K}$, a first reference device $R_{ref1}$ coupled to first input node $N_{in1}$ and first output node $N_{out1}$, and a first target device 110 coupled to first selecting nodes $N_{s11}$, ..., $N_{s1K}$ and the first output node Nout1a. In this embodiment, the first output node $N_{out1a}$ is a pin of the semiconductor device 100 to output a voltage level to the measuring device 402. The first target device 110 comprises a plurality of first devices under test (DUTs) $110_{(1)}$, ..., $110_{(K)}$ each coupled to the first selecting nodes $N_{s11}$, ..., $N_{s1K}$, respectively. The second testing block 104 comprises: a second input node $N_{in2}$, a second output node $N_{out2a}$, a plurality of second selecting nodes $N_{s21}$, ..., $N_{s2K}$, a second reference device $R_{ref2}$ coupled to the second input node $N_{in2}$ and the second output node $N_{out2a}$, and a second target device 112 coupled to the second selecting nodes $N_{s21}$, ..., $N_{s2K}$ and the second output node $N_{out2a}$. In this embodiment, the second output node $N_{out2a}$ is a pin of the semiconductor device 100 to output a voltage level to the measuring device 402. The second target device 112 comprises a plurality of second devices under test (DUTs) $112_{(1)}$, ..., $112_{(K)}$ each coupled to the second selecting nodes $N_{s21}$ ... $N_{s2K}$, respectively.

The first DUTs $110_{(1)}$, ..., $110_{(K)}$ and the second DUTs $112_{(1)}$, ..., $112_{(K)}$ have a one-to-one relationship. Additionally, the switch units implemented by transistors $M_1$-$M_K$, are respectively coupled to the first selecting nodes $N_{s11}$ ... $N_{s1K}$. Switch units implemented by transistors $N_1$-$N_K$, are also respectively coupled to the second selecting nodes $N_{s21}$ ... $N_{s2K}$. The selector 1064 is for simultaneously selecting a specific first selecting node and a specific second selecting node to enable a specific first DUT, being coupled to the specific first selecting node and a specific second DUT (coupled to the specific second selecting node) for testing. For example, if the selector 1064 turns on transistors $M_1$ and $N_1$, the first DUT $110_{(1)}$ and the second DUT $112_{(1)}$ are selected to be tested. Each output pin of the selector 1084 is used for selecting one differential testing group. As shown in FIG. 4, the switch units, implemented by transistors $S_{11}$, $S_{12}$ are respectively coupled to the first input node $N_{in1}$ and second input node $N_{in2}$. Therefore, when the selector 1084 turns on the transistors $S_{11}$, $S_{12}$, the differential testing group 102a is selected.

According to the present invention, each DUT is equivalent to a resistor comprising a combination of different layout configurations with vias, contacts, traces, or other semiconductor components. This may also include stacked via-chains, un-stacked via-chains, and double vias chain. However, according to the one-to-one relationship of the first DUTs $110_{(1)}$, ..., $110_{(K)}$ and the second DUTs $112_{(1)}$, ..., $112_{(K)}$ of the present invention, the layout configuration of a DUT, such as the first DUT $110_{(1)}$, should be identical to the corresponding DUT (the second DUT $112_{(1)}$). That is, the first DUT $110_{(1)}$ and the second $DUT_{(1)}$ should be fabricated under the same layout design using the same semiconductor process.

As an example, assume that the first DUT $110_{(1)}$ and the second DUT $112_{(1)}$ are going to be tested by the measuring device 402. Therefore, the measuring device 402 generates a selection signal to the selector 1064 via pins $P_1$ for instructing the selector 1064 to only generate a high voltage to gates of transistors $M_1$ and $N_1$, to connect the first and second selecting nodes Ns11 and NS21 to ground. Simultaneously, the measuring device 402 outputs another selection signal to the selector 1084 via pins $P_2$ for instructing the selector 1084 to only generate a low voltage to gates of transistors $S_{11}$ and $S_{12}$. Therefore, after the transistors S11 and S12 are turned on, two current signals $I_{11}$ and $I_{12}$ are delivered to the first input node $N_{in1}$ and the second input node $N_{in2}$, respectively. In other words, current signal $I_{11}$ only flows through the first DUT $110_{(1)}$ while current signal $I_{12}$ only flows through the second DUT $112_{(1)}$. According to an embodiment of the present invention, the first reference device $R_{ref1}$ and the second reference device $R_{ref2}$ are implemented by high tolerance resistors each having the same resistance value R. Therefore, a voltage $V_{out1}$ at the first output node $N_{out1a}$ is ideally equal to a voltage $V_{out2}$ at the second output node $N_{out2a}$.

However, whenever a problem occurs in the process of manufacturing, the voltage $V_{out1}$ and $V_{out2}$ may be different due to a mismatch (e.g., a random defect in semiconductor process) between the first DUT and the corresponding second DUT. According to this example, when a via in the first DUT $110_{(1)}$ is opened, the current signal $I_{11}$ is unable to flow to the ground through the first DUT $110_{(1)}$. Therefore, voltage $V_{out1}$, becomes $V_{dd}$, which is higher than voltage $V_{out2}$ if current signal $I_{12}$ is able to flow through the second DUT $112_{(1)}$. In this case, voltage $V_{out1}$ does not equal voltage $V_{out2}$, the measuring device 402 can compare the difference between voltage $V_{out1}$ and voltage $V_{out2}$ (i.e., $V_{out1}$>$V_{out2}$ or $V_{out1}$<$V_{out2}$) to determine if there is a failure happening to at least a via of the first DUT $110_{(1)}$ or the second DUT $112_{(1)}$. Accordingly, a semiconductor failure can be tested.

After testing for a large number of DUTs by advancing each selection adopted by the first selecting device 106, the measuring device 402 can collect all failures. Please note that process variation may occur in the manufacturing process, and the actual resistance value of the via may therefore deviate from the ideal resistance value. However, because the disclosed testing scheme evaluates a difference between the voltage $V_{out1}$ and the voltage $V_{out2}$ to detect failures caused by the semiconductor process, the testing is not affected by a process variation. In other words, the differential testing scheme is capable to detect the random defected device within the target devices and at the same time to avoid the lot-to-lot process variation of the target devices. For example, if a process variation occurs, the process variation affects the entire wafer. Using the first DUT $110_{(1)}$ and the second DUT $112_{(1)}$ for example, both DUTs have resistance values different from the target resistance value, but the resistance values however are identical. In this case, the measuring device 402 still obtains the result that voltage $V_{out1}$ is equal to voltage $V_{out2}$ if there is no hard-fail affecting the fabricated DUTs. Furthermore, if the soft fail occurs in the manufacturing process, both resistance values of the first DUT $110_{(1)}$ and the second DUT $112_{(1)}$ will be slightly differ from the target resistance value, but the difference between the voltage $V_{out1}$ and the voltage $V_{out2}$ remains zero, thus the testing system 30 of the present invention will determine that a soft fail occurred. In short, the testing system 30 of the present invention is able to detect and discern components from a hard-fail or a soft-fail without being affected by a process variation.

In this embodiment, the selectors 1064 and 1084 are implemented by N-to-$N^2$ selectors, such as 4-to-16 selectors described in the related art. The implementation of the selector is to reduce the number of pins required by the disclosed testing scheme. However, using selectors is not intended to be a limitation of the present invention. For example, in other embodiments of the present invention that do not limit the number of pins, one of the selectors 1064 and 1084 can be omitted, or all the selectors 1064 and 1084 are allowed to be omitted. In addition, the above embodiment measures voltage differences to detect component failures. However, the testing system 30 of the present invention can also use the measuring device 402 to measure a current difference to identify component failure. For example, the measuring device 402 measures the difference between current $I_{11}$ and $I_{12}$ to identify which one of the first DUT $110_{(1)}$ and second DUT $112_{(1)}$ is affected by a hard-fail.

As mentioned above, the differential testing groups 102a-102c have the same circuit configuration as that shown in FIG. 4. Therefore, the selection of other differential testing groups and DUTs is therefore similar to the selection made for differential testing group 102a. Further description is thus omitted for the sake of brevity.

One advantage of using the testing scheme of the present invention is that more accurate and sensitive measurement data can be obtained from measuring the difference between a first output node Nout1a and a second output node Nout2a. As known to those skilled in the art, the measuring device 402, including a current meter or voltage meter, has different modes to measure different electrical performance ranges. For example, the measuring device 402 can be a current meter/voltage meter supporting a first mode suitable for measuring large current values (e.g., 1.2345 mA) and voltages (1.2345V), and a second mode suitable for measuring small currents (e.g., 1.2345 uA) and voltages (1.2345 mV). It is obvious that the sensitivity & accuracy of the second mode is better than that of the first mode. Referring to the prior art, because it is designed to measure actual voltage values, the first mode with poorer sensitivity & accuracy is enabled. However, with the present invention, the testing system 30 measures the difference existing between the first output node $N_{out1a}$ and the second output node $N_{out2a}$ instead of the actual voltage/current values at the $N_{out1a}$ and the second output node $N_{out2a}$. Therefore, the second mode with improved sensitivity & accuracy is enabled. Compared to the prior art testing schemes, the testing scheme of the present invention can better and more accurately detect the process failure rate because accurate measurement data is obtained.

Figure 5:
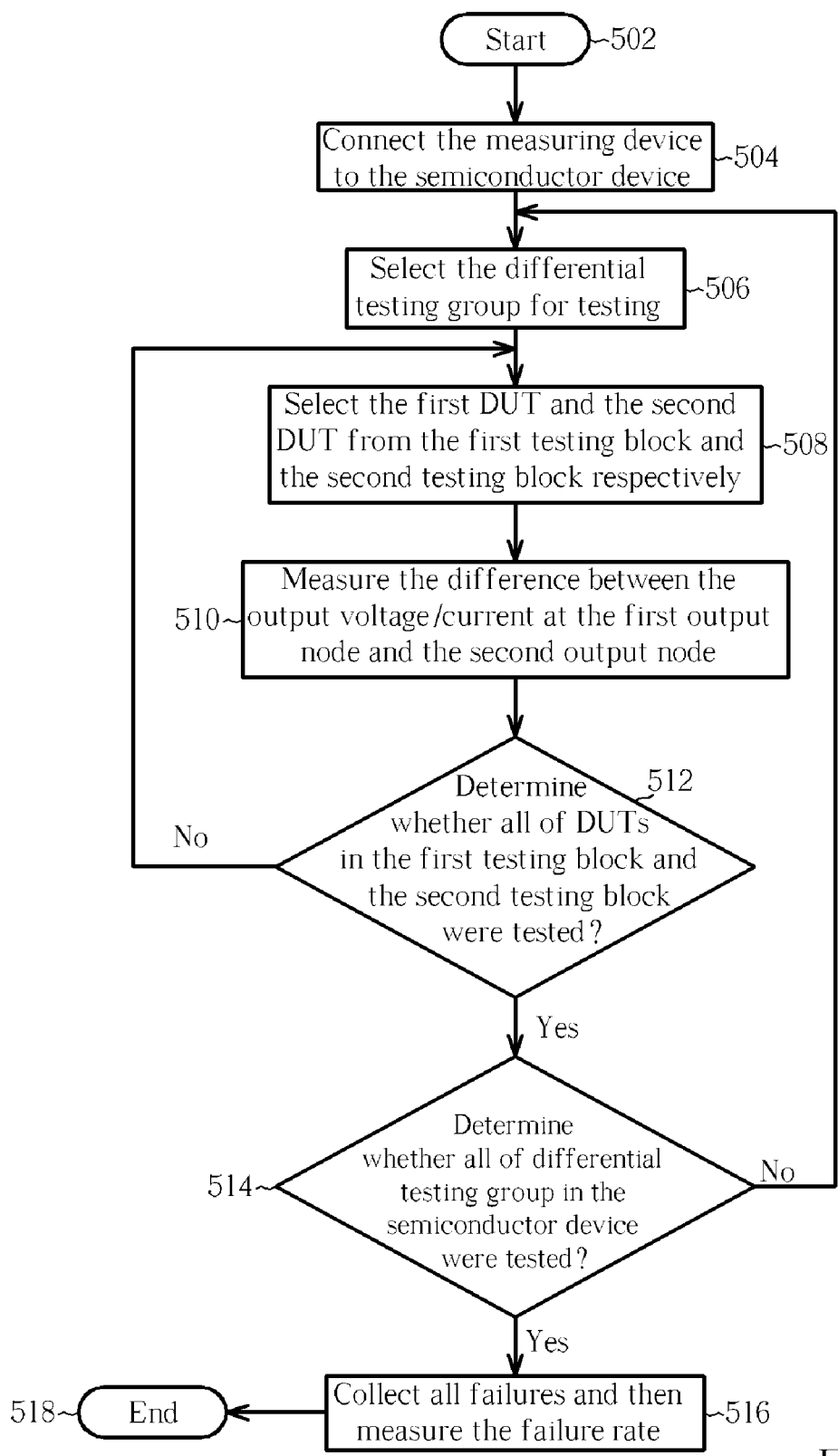
FIG. 5 illustrates a flowchart of a testing method for monitoring a semiconductor process applied to the manufacturing of a semiconductor device.

Please refer to FIG. 5. FIG. 5 illustrates a flowchart of a testing method for testing a semiconductor process applied to the manufacturing of a semiconductor device 100, according to an embodiment of the present invention. The testing method is performed using the testing system 30 shown in FIG. 3, and comprises the following steps:

Step 502: Start;
Step 504: Connect the measuring device 402 to the semiconductor device 100;
Step 506: Select the differential testing group 102a for testing;
Step 508: Select the first DUT $110_{(1)}$ and the second DUT $112_{(1)}$ from the first testing block 103 and the second testing block 104 respectively;
Step 510: Measure the difference between the output voltage and current at the first output node Nout1a and the second output node Nout2a to test the first DUT $110_{(1)}$ and the second DUT $112_{(1)}$;
Step 512: Determine whether all of DUTs in the first testing block 103 and the second testing block 104 were tested; if yes, skip to Step 514; if no, skip to Step 508;
Step 514: Determine whether all of differential testing groups in the semiconductor device 100 were tested; if yes, skip to Step 516; if no, skip to Step 506;
Step 516: collect all failures and then measure the failure rate; and
Step 518: End.

According to step 508, the DUTs correspond to a differential testing group selected in step 506, wherein each DUT is equivalent to a resistor comprising a combination of different layout configurations with vias, contacts, and traces. Also, other semiconductor components such as the stacked via-chains, un-stacked via-chains, and double vias chain can be used. If step 512 determines that not all of DUTs in the first testing block 103 and the second testing block 104 were tested, step 508 is repeated to select another set of DUTs. If step 514 determines that not all of differential testing group were tested, then step 506 is also repeated to select another differential group.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device for testing a semiconductor process applied to manufacturing the semiconductor device, the semiconductor device comprising:
   at least a testing group, comprising:
      a first testing block, comprising:
         a first input node;
         a first output node;
         a plurality of first selecting nodes;
         a first reference device coupled to the first input node and the first output node; and
         a first target device coupled to the first selecting nodes and the first output node, the first target device comprising a plurality of first devices under test (DUTs) each coupled to a first selecting node; and
      a second testing block, comprising:
         a second input node;
         a second output node;
         a plurality of second selecting nodes;
         a second reference device coupled to the second input node and the second output node; and
         a second target device coupled to the second selecting nodes and the second output node, the second target device comprising a plurality of second devices under test (DUTs) each coupled to a second selecting node;
   wherein the first DUTs and the second DUTs have a one-to-one relationship.

2. The semiconductor device of claim 1, wherein a layout of the first testing block is symmetric to a layout of the second testing block.

3. The semiconductor device of claim 1 further comprising:
a first selecting device coupled to the first selecting nodes and the second selecting nodes, for simultaneously selecting a specific first selecting node and a specific second selecting node to enable a specific first DUT coupled to the specific first selecting node and a specific second DUT coupled to the specific second selecting node to be tested.

4. The semiconductor device of claim 3, wherein the first selecting device comprises:
a plurality of switch units respectively coupled to the first selecting nodes and the second selecting nodes for selectively connecting the first DUTs and the second DUTs to the second input signal; and
a selector coupled to the switch units for simultaneously turning on a first switch unit coupled to the specific first selecting node and a second switch unit coupled to the specific second selecting node to enable the specific first DUT and the specific second DUT to be tested.

5. The semiconductor device of claim 3, wherein the semiconductor device has a plurality of testing groups, the first selecting device is coupled to first selecting nodes and second selecting nodes of each testing group for simultaneously selecting a specific first selecting node and a specific second selecting node of each testing group to enable a specific first DUT coupled to the specific first selecting node and a specific second DUT coupled to the specific second selecting node to be tested, and the semiconductor device further comprises:
a second selecting device coupled to a first input node and a second input node of each testing group, for simultaneously selecting a first input node and a second input node of a specific testing group to enable the specific testing group to be tested.

6. The semiconductor device of claim 5, wherein the second selecting device comprises:
a plurality of switch units respectively coupled to first input nodes and second input nodes of the testing group for selectively conducting the first inputs nodes and the second input nodes to the first input signal; and
a selector coupled to the switch units for simultaneously turning on a first switch unit coupled to the first input node of the specific testing group and a second switch unit coupled to the second input node of the specific testing group for enabling the specific testing group to be tested.

7. The semiconductor device of claim 1, wherein the first reference device is a resistive component having a predetermined resistance value, and the second reference device is a resistive component having the predetermined resistance value.

8. A testing system for testing a semiconductor process applied to manufacturing a semiconductor device, the testing system comprising:
the semiconductor device, comprising:
at least a testing group, comprising:
a first testing block, comprising:
a first input node;
a first output node;
a plurality of first selecting nodes;
a first reference device coupled to the first input node and the first output node; and
a first target device coupled to the first selecting nodes and the first output node, the first target device comprising a plurality of first devices under test (DUTs) each coupled to a first selecting node; and
a second testing block, comprising:
a second input node;
a second output node;
a plurality of second selecting nodes;
a second reference device coupled to the second input node and the second output node; and
a second target device coupled to the second selecting nodes and the second output node, the second target device comprising a plurality of second devices under test (DUTs) each coupled to a second selecting node, wherein the first DUTs and the second DUTs have a one-to-one relationship; and
a measuring device coupled to the semiconductor device for coupling the first input node and the second input node to a first input signal, coupling a specific first selecting node and a specific second selecting node to a second input signal, and measuring a difference between output signals at the first output node and the second output node to evaluate the semiconductor process, wherein a specific first DUT coupled to the specific first selecting node corresponds to a specific second DUT coupled to the specific second selecting node according to the one-to-one relationship.

9. The testing system of claim 8, wherein a layout of the first testing block is symmetric to a layout of the second testing block.

10. The testing system of claim 8, wherein the semiconductor device further comprises:
a first selecting device coupled to the first selecting nodes and the second selecting nodes, the first selecting device for simultaneously selecting the specific first selecting node and the specific second selecting node to enable the specific first DUT coupled to the specific first selecting node and the specific second DUT coupled to the specific second selecting node to be tested; and
providing a first selection signal to the first selecting device to select the specific first DUT and the specific second DUT utilizing the measuring device.

11. The testing system of claim 10, wherein the first selecting device comprises:
a plurality of switch units respectively coupled to the first selecting nodes and the second selecting nodes for selectively connecting the first DUTs and the second DUTs to the second input signal; and
a selector coupled to the switch units for simultaneously turning on a first switch unit coupled to the specific first selecting node and a second switch unit coupled to the specific second selecting node to enable the specific first DUT and the specific second DUT to be tested.

12. The testing system of claim 10, wherein the semiconductor device has a plurality of testing groups, the first selecting device is coupled to first selecting nodes and second selecting nodes of each testing group for simultaneously selecting a specific first selecting node and a specific second selecting node of each testing group to enable a specific first DUT coupled to the specific first selecting node and a specific second DUT coupled to the specific second selecting node to be tested, the semiconductor device further comprises:
a second selecting device coupled to a first input node and a second input node of each testing group for simultaneously selecting a first input node and a second input node of a specific testing group enabling the specific testing group to be tested; and the measuring device further provides a second selection signal to the second selecting device to select the specific testing group.

13. The testing system of claim 12, wherein the second selecting device comprises:
   a plurality of switch units respectively coupled to first input nodes and second input nodes of the testing groups, for selectively conducting the first inputs nodes and the second input nodes to the first input signal; and
   a selector coupled to the switch units for simultaneously turning on a first switch unit coupled to the first input node of the specific testing group and a second switch unit coupled to the second input node of the specific testing group to enable the specific testing group to be tested.

14. The testing system of claim 8, wherein the first reference device is a resistive component having a predetermined resistance value, and the second reference device is a resistive component having the predetermined resistance value.

15. A method for testing a semiconductor process applied to manufacturing a semiconductor device, comprising:
   coupling a first input node and a second input node of the semiconductor device to a first input signal, and selectively coupling a specific first selecting node and a specific second selecting node of the semiconductor device to a second input signal, wherein the semiconductor device comprises:
   at least a testing group, comprising:
      a first testing block, comprising:
         the first input node;
         a first output node;
         a plurality of first selecting nodes, including the specific first selecting node;
         a first reference device coupled to the first input node and the first output node; and
         a first target device coupled to the first selecting nodes and the first output node, the first target device comprising a plurality of first devices under test (DUTs) each coupled to a first selecting node; and
      a second testing block, comprising:
         the second input node;
         a second output node;
         a plurality of second selecting nodes, including the specific second selecting node;
         a second reference device coupled to the second input node and the second output node; and
         a second target device coupled to the second selecting nodes and the second output node, the second target device comprising a plurality of second devices under test (DUTs) each coupled to a second selecting node, wherein the first DUTs and the second DUTs have a one-to-one relationship; and
   measuring a difference between output signals at the first output node and the second output node to evaluate the semiconductor process, wherein a specific first DUT coupled to the specific first selecting node corresponds to a specific second DUT coupled to the specific second selecting node according to the one-to-one relationship.

16. The method of claim 15, wherein a layout of the first testing block is symmetric to a layout of the second testing block.

17. The method of claim 15, wherein the first reference device is a resistive component having a predetermined resistance value, and the second reference device is a resistive component having the predetermined resistance value.

* * * * *